(12) United States Patent
Lipson et al.

(10) Patent No.: US 8,168,017 B2
(45) Date of Patent: May 1, 2012

(54) BONDING SILICON SILICON CARBIDE TO GLASS CERAMICS

(75) Inventors: Matthew Lipson, Stamford, CT (US); Robert D. Harned, Redding, CT (US); Geoffrey O'Connor, Easton, CT (US); Timothy O'Neil, New Milford, CT (US)

(73) Assignee: ASML Holding N.V., Veldhoven (NL)

( * ) Notice: Subject to any disclaimer, the term of this patent is extended or adjusted under 35 U.S.C. 154(b) by 165 days.

(21) Appl. No.: 12/700,049

(22) Filed: Feb. 4, 2010

(65) Prior Publication Data
US 2010/0128242 A1    May 27, 2010

Related U.S. Application Data

(62) Division of application No. 11/626,747, filed on Jan. 24, 2007, now Pat. No. 7,678,458.

(51) Int. Cl.
*B29C 65/00* (2006.01)
*B05D 1/36* (2006.01)
*C03B 29/00* (2006.01)
*C09J 5/00* (2006.01)

(52) U.S. Cl. ............... 156/60; 427/207.1; 156/89.11; 156/297; 156/305

(58) Field of Classification Search ............ 156/89.11; 355/72; 427/207.1
See application file for complete search history.

(56) References Cited

U.S. PATENT DOCUMENTS

| | | |
|---|---|---|
| 2,015,972 A | 10/1935 | Södergren |
| 2,384,269 A | 9/1945 | Bake |
| 3,007,832 A | 11/1961 | Milne |
| 3,409,198 A | 11/1968 | Peterman, Sr. |
| 3,880,632 A | 4/1975 | Podvigalkina |
| 4,324,592 A | 4/1982 | Patel et al. |
| 4,644,632 A | 2/1987 | Mächler et al. |
| 4,824,807 A | 4/1989 | Blount |
| 4,847,218 A | 7/1989 | Schittenhelm et al. |
| 4,900,387 A | 2/1990 | Johnson |
| 4,908,339 A | 3/1990 | Blount |
| 4,945,074 A | 7/1990 | Blount |
| 4,973,564 A | 11/1990 | Chyung et al. |

(Continued)

FOREIGN PATENT DOCUMENTS
JP    2003-282685 A1    10/2003
(Continued)

OTHER PUBLICATIONS

Puers, R. and Cozma, A., "Bonding wafers with sodium silicate solution," *J. Micromech. Microeng.* 7:114-117, Institute of Physics Publishing (1997).

(Continued)

*Primary Examiner* — Philip Tucker
*Assistant Examiner* — Alex Efta
(74) *Attorney, Agent, or Firm* — Sterne, Kessler, Goldstein & Fox P.L.L.C.

(57) ABSTRACT

A wafer chuck for use in a lithographic apparatus, which includes a low-thermal expansion glass ceramic substrate, a silicon silicon carbide layer, and a bonding layer comprising silicate having a strength of at least about 5 megapascals, the bonding layer attaching the silicon silicon carbide layer to the substrate is described. Also, a method of forming a wafer chuck for use in a lithographic apparatus, which includes coating a portion of one or both of a low-thermal expansion glass ceramic substrate and a silicon silicon carbide layer with a bonding solution, and contacting the substrate and the silicon silicon carbide layer to bond the substrate and the silicon silicon carbide layer together is described.

3 Claims, 7 Drawing Sheets

U.S. PATENT DOCUMENTS

| | | | |
|---|---|---|---|
| 5,238,518 A | 8/1993 | Okubi et al. | |
| 5,285,142 A | 2/1994 | Galburt et al. | |
| 5,296,428 A | 3/1994 | Degnan et al. | |
| 5,332,432 A | 7/1994 | Okubi et al. | |
| 5,413,620 A | 5/1995 | Henry | |
| 5,574,811 A | 11/1996 | Bricheno et al. | |
| 5,578,179 A | 11/1996 | Demorest et al. | |
| 5,592,288 A | 1/1997 | Sampica et al. | |
| 5,604,160 A | 2/1997 | Warfield | |
| 5,641,349 A | 6/1997 | Koubek et al. | |
| 5,669,997 A | 9/1997 | Robbert et al. | |
| 5,991,493 A | 11/1999 | Dawes et al. | |
| 5,995,293 A | 11/1999 | Derkits, Jr. et al. | |
| 6,048,811 A * | 4/2000 | Morena | 501/15 |
| 6,117,794 A | 9/2000 | Dormer et al. | |
| 6,122,115 A | 9/2000 | Plummer et al. | |
| 6,129,854 A | 10/2000 | Ramsey et al. | |
| 6,162,543 A | 12/2000 | Dubots et al. | |
| 6,176,588 B1 * | 1/2001 | Davis et al. | 359/848 |
| 6,284,085 B1 | 9/2001 | Gwo | |
| 6,297,009 B1 | 10/2001 | Demorest et al. | |
| 6,346,305 B1 | 2/2002 | Ramsey et al. | |
| 6,403,155 B2 | 6/2002 | Dubots et al. | |
| 6,428,896 B1 | 8/2002 | Ramsey et al. | |
| 6,548,176 B1 | 4/2003 | Gwo | |
| 6,556,281 B1 | 4/2003 | Govil et al. | |
| 6,591,892 B1 | 7/2003 | Moore et al. | |
| 6,699,341 B2 * | 3/2004 | Conzone et al. | 156/89.11 |
| 6,806,006 B2 | 10/2004 | Lercel et al. | |
| 6,949,164 B2 | 9/2005 | Sabia | |
| 6,950,175 B2 | 9/2005 | Galburt et al. | |
| 6,956,222 B2 * | 10/2005 | Gilissen et al. | 250/492.2 |
| 7,009,359 B2 | 3/2006 | del Puerto | |
| 7,025,498 B2 | 4/2006 | del Puerto | |
| 7,122,085 B2 | 10/2006 | Shero et al. | |
| 7,270,885 B1 | 9/2007 | Karandikar et al. | |
| 7,678,458 B2 | 3/2010 | Lipson et al. | |
| 2002/0044267 A1 * | 4/2002 | Ackerman et al. | 355/53 |
| 2004/0213955 A1 | 10/2004 | Boyle et al. | |
| 2005/0101082 A1 | 5/2005 | Yokoyama et al. | |
| 2005/0260930 A1 | 11/2005 | Okuda et al. | |
| 2007/0097346 A1 * | 5/2007 | Zaal et al. | 355/72 |
| 2007/0221326 A1 | 9/2007 | Rowan et al. | |

FOREIGN PATENT DOCUMENTS

| | | | |
|---|---|---|---|
| JP | 2005-203537 A1 | 7/2005 | |
| JP | 2007-005762 A | 1/2007 | |
| TW | 373285 A | 11/1999 | |
| TW | 200503054 A | 1/2005 | |
| TW | I271443 B | 1/2007 | |
| WO | WO 03/038881 A1 | 5/2003 | |
| WO | WO 2005/097709 A1 | 10/2005 | |
| WO | WO 2005097709 A1 * | 10/2005 | |

OTHER PUBLICATIONS

Satoh, A., "Water glass bonding," *Sensors and Actuators A72*:160-168, Elsevier Science S.A. (1999).

English language Abstract of JP 2007-005762 A filed Jan. 11, 2007, 1 pg.

English language abstract of JP 2003-282685 A1, published Oct. 3, 2003; 1 page.

English language abstract of JP 2005-203537 A1, published Jul. 28, 2005; 1 page.

English translation of Japanese Notification Reasons for Refusal directed to related Japanese Application No. 2008-012533, mailed Dec. 7, 2010 from the Japan Patent Office, Japan; 4 pages.

English-Language Translation of Office Action of the IPO with Search Report directed to related Taiwanese Patent Application No. 097101685, mailed Aug. 30, 2011, from the Taiwan Intellectual Property Office; 4 pages.

Notice of Allowance mailed Oct. 26, 2009 for U.S. Appl. No. 11/626,747, filed Jan. 24, 2007; 9 pages.

* cited by examiner

BONDING SILICON SILICON CARBIDE TO GLASS CERAMICS

CROSS-REFERENCE TO RELATED APPLICATIONS

This application is a divisional of U.S. patent application Ser. No. 11/626,747, filed Jan. 24, 2007 now U.S. Pat. No. 7,678,458, which is incorporated by reference herein in its entirety.

BACKGROUND OF THE INVENTION

1. Field of the Invention

The present invention relates to a chuck used to hold a substrate during a lithographic process. More specifically, this invention relates to a process for bonding silicon silicon carbide to glass ceramics to form a chuck.

2. Background

Lithography is a process used to create features on the surface of substrates. During lithography, a wafer is disposed on a wafer stage and held in place by a chuck. The chuck is typically a vacuum chuck capable of securely holding the wafer in place. The wafer is exposed to an image projected onto its surface by exposure optics located within a lithography apparatus. While exposure optics are used in the case of photolithography, a different type of exposure apparatus can be used depending on the particular application. For example, x-ray, ion, electron, or photon lithographies each can require a different exposure apparatus, as is known to those skilled in the relevant art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is done by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the sharpness of the image projected onto the wafer is maximized. While using a step-and-scan technique generally assists in improving overall image sharpness, image distortions generally occur in such systems due to imperfections within the projection optics system, illumination system, the particular reticle being used and temperature differentials between the wafer and lithography tools.

Lithography tools typically require a thermally stable environment. Light sources and illumination during lithography introduces heat into the system. A typical temperature range for a scanning lithography tool would be between about 18 and 22° C. While under steady state scanning conditions, temperatures in a wafer chuck itself may vary plus-or-minus about one (+/−1)° C. Nonetheless, because of the extremely small tolerances of the precision stages (e.g., on the order of about 10 nm or less), even small changes in temperature can cause unintended thermally induced changes in the dimensions of precision stages. Therefore, methods for controlling temperature in lithography tools, and in particular wafer chucks, during lithography scanning is required.

Lithography tools also require extremely quiet environments with respect to motion and vibration. For this reason, chucks are typically magnetically positioned and propelled within lithography tools. This places great demands on scanning and alignment control systems. The extent of control is directly related to system frequency, which is, in turn, directly related to the specific stiffness of the chuck. Therefore, what is needed are lithography tools, including wafer chucks, with improved properties that allow for temperature control and high quality lithographic scanning.

BRIEF SUMMARY OF THE INVENTION

One embodiment relates to a wafer chuck for use in a lithographic apparatus, which includes a low-thermal expansion glass ceramic substrate, a silicon silicon carbide layer, and a bonding layer comprising silicate having a strength of at least about 5 megapascals, the bonding layer attaching the silicon silicon carbide layer to the substrate.

Another embodiment relates to a method of forming a wafer chuck for use in a lithographic apparatus, which includes coating a portion of one or both of a low-thermal expansion glass ceramic substrate and a silicon silicon carbide layer with a bonding solution, and contacting the substrate and the silicon silicon carbide layer to bond the substrate and the silicon silicon carbide layer together.

Another embodiment relates to a wafer chuck made according to the methods described herein.

Further embodiments, features, and advantages of the invention, as well as the structure and operation of the various embodiments of the invention are described in detail below with reference to accompanying drawings.

BRIEF DESCRIPTION OF THE DRAWINGS/FIGURES

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings and examples.

It should be appreciated that the particular implementations shown and described herein are examples of the invention and are not intended to otherwise limit the scope of the present invention in any way. Indeed, for the sake of brevity, conventional electronics, manufacturing, semiconductor devices, and lithography technologies and other functional aspects of the systems (and components of the individual operating components of the systems) may not be described in detail herein.

Embodiments of the Lithographic Table

Figure 1:
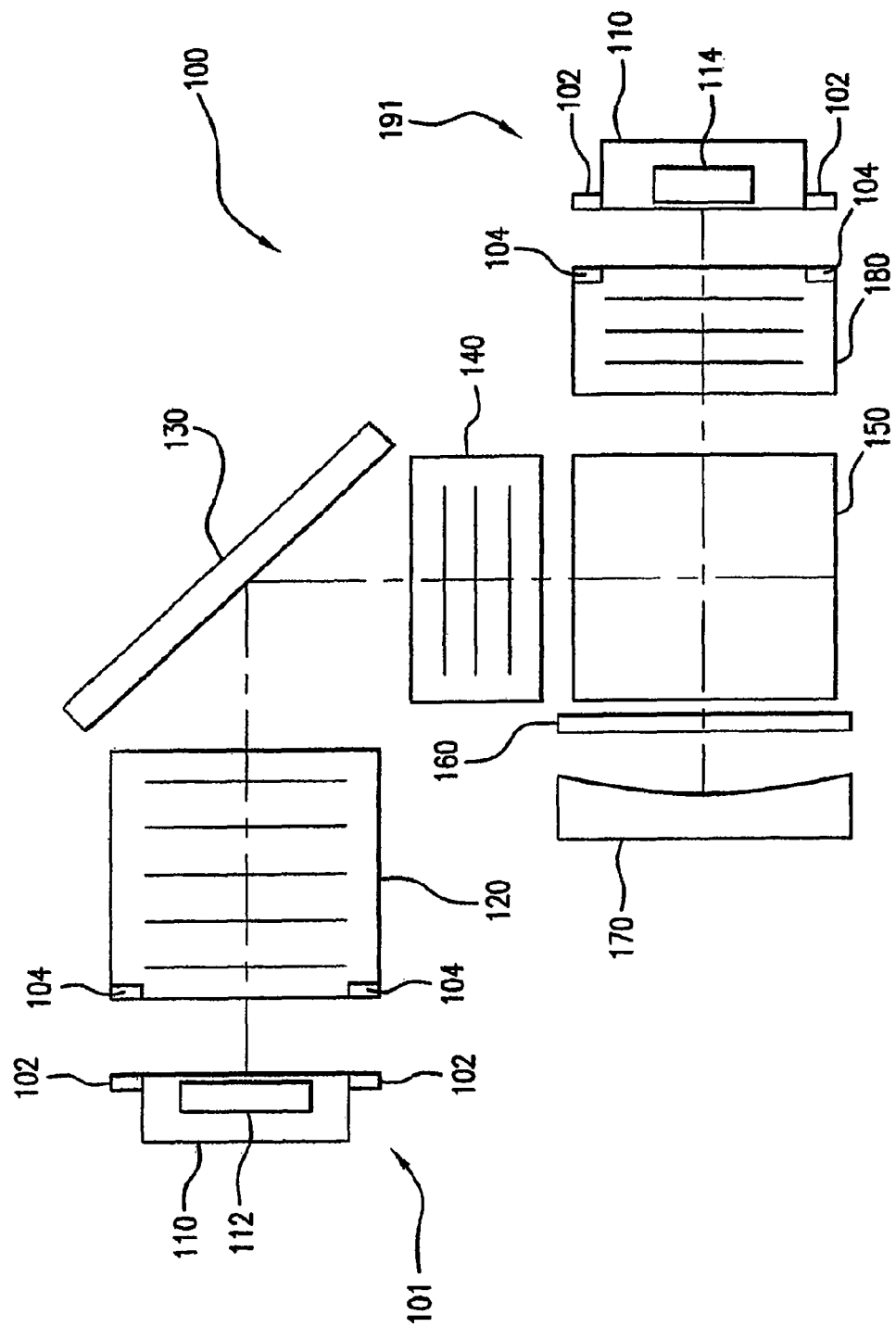
FIG. 1 shows an example lithographic environment in which a wafer chuck can be situated.

FIG. 1 depicts an example environment in which a chuck 110 can be situated. Apparatus 100 is a conventional projection optics system as can exist in a scanning lithography tool. A reticle stage 101 is followed by a first lens group 120, a folding mirror 130, a second lens group 140, a beam splitter 150, a wave plate 160, a concave mirror 170, a third lens group 180, and a wafer stage 191. A chuck 110 is typically used, for example, to hold a reticle 112 in the reticle stage 101, or a wafer 114 in the wafer stage 191. In the case where chuck 110 is used to hold wafer 114 in wafer stage 191, the chuck is referred to as a wafer chuck. Optionally chuck 110 can also have an extra encoder or interferometer for measuring thermal expansion if the positioning requirements so justify.

Chucks can also be used to hold and position other objects, such as mirrors, within a lithography tool. Additionally, chucks can be used in lithography tools that do not contain projection optics, such as a contact lithography tools, in maskless lithography tools, as well as in lithography tools with projection optics designs substantially different from this example. Chucks are designed to meet the specific working requirements of lithographic systems.

Embodiments of the Wafer Chuck Materials

An embodiment relates to a wafer chuck for use in a lithographic apparatus, comprising a low-thermal expansion glass ceramic, a silicon silicon carbide layer, and a bonding layer comprising silicate having a strength of at least about 5 megapascals, the bonding layer attaching the silicon silicon carbide layer to the substrate.

In one embodiment, the low-thermal expansion glass ceramic substrates of the wafer chucks comprise fluid channels. The fluid channels can be introduced into the substrates by any method known to one of ordinary skill in the art. For example, the channels are included in the substrate when the substrate is formed. In another example, the channels are etched into the substrate after the substrate is formed. Fluid channels facilitate temperature control during lithography. During lithography, as the wafer is illuminated, the temperature of the wafer increases. The wafer is seated against the wafer chuck, and the heat is transferred to the wafer chuck. If the wafer chuck has a different coefficient of expansion than the wafer, positional control of the illumination and lithography precision can decrease if the lithography system does not compensate for the uneven expansions. One method of limiting this problem is to control the temperature of the wafer chuck and wafer, and maintain the wafer chuck and wafer at, or as close to as possible, the same temperature. The fluid channels of the present invention allow fluid to move through the wafer chuck and cool, or heat, the wafer chuck, and the wafer resting on the wafer chuck, as needed. Any fluid can be used in the fluid channels that facilitates temperature control of the wafer chuck. One example fluid is water. Other fluids include, but are not limited to oils and fluorinated hydrocarbons. The fluids can be formulated to include optional additives, such as pH buffers, salts, surfactants, antioxidants, viscosity modifiers, and other additives.

Fluid can be pumped through the fluid channels in the low-thermal expansion glass ceramic substrate to facilitate temperature control of the wafer chuck and the wafer. The fluid being pumped through the fluid channels can heat or cool the wafer chuck and wafer. In an embodiment, the wafer chuck and wafer are held at the same temperature during lithographic scanning, within +/−1° C.

In one example, the fluid is pumped through the channels at a pressure between about 65 kilopascals and 350 kilopascals. The necessary pumping apparatus and techniques are known to a person having ordinary skill in the art. In one embodiment, the silicon silicon carbide layer is at least partially in contact with the fluid channels. In another embodiment, the bonding layer is configured to seal the fluid channels using the silicon silicon carbide layer and the substrate. The bonding layer can at least partially be in contact with the fluid in the fluid channels. Any bonding layer present in the wafer chuck, therefore, must be sufficiently strong to bond the low-thermal expansion glass ceramic substrate to the silicon silicon carbide layer while the fluid is pumped through the channels without failing. Peeling forces at the edge of the channels can be as high as about 3.5-5.0 megapascals. In an embodiment, therefore, the bonding layer is configured to seal the fluid channels under fluid pressure of at least about 2.5 megapascals. In another embodiment, the bonding layer has a strength of at least about 5 megapascals.

In an embodiment, the wafer chuck comprises a low-thermal expansion glass ceramic substrate. Glass ceramics, which generally comprise an inorganic, non-porous material having a crystalline phase and a glassy phase, are known for specialized applications. Such glass ceramics are manufactured by selecting suitable raw materials, melting, refining, homogenizing, and then hot forming the material into a glassy blank. After the glassy blank is cooled and annealed, a temperature treatment follows whereby the glassy blank is transformed into a glass ceramic by controlled volume crystallization (ceramization). Ceramization is a two-step process; nuclei are formed within the glass at one temperature, and then grown at a higher temperature. The dual structure of the glass ceramic material can impart special properties, including a very low coefficient of thermal expansion (CTE).

In one example, the low-thermal expansion glass ceramic substrate comprises a mixture of negative thermal expansion material and positive thermal expansion material. In another example, the glass ceramic comprises silicon dioxide and aluminum oxide. A variety of forms of silicon dioxide can be used in the glass ceramics of the present invention. One example is β-quartz. In another example, the low-thermal expansion glass ceramic comprises a mixture of silicon dioxide and a mixed metal oxide. Mixed metal oxides for use in the present invention include, but are not limited to, metal oxides of silicon and aluminum. One example of a mixed metal oxide that can be used is β-eucryptite. In another example, the low-thermal expansion glass ceramic is commercially available, for example, Zerodur® (available from Schott Glass Technologies, Duryea, Pa.) or ULE® (available from Corning, Inc., Corning, N.Y.).

Low-thermal expansion glass ceramic substrate surfaces can be polished to very high smoothness and can form optical contact bonds with other highly polished surfaces. Surfaces of the low-thermal expansion glass ceramic substrates have silicon oxide (—O—Si—O—) and hydrated silicon oxide bonds (—Si—OH). The low-thermal expansion glass ceramic substrates can generally be polished to smoothness of less than about 1 nm, and alternatively as smooth as 0.25 nm. These very smooth surfaces can form optical contact bonds with silicon wafers that are likewise polished to high smoothness. Therefore, while low-thermal expansion glass ceramic substrates have some desirable properties as materials for wafer chucks, there are issues that arise in their use. For example, the high smoothness of the surfaces of both the low-thermal expansion glass ceramic substrate and silicon wafers allows for optical contact bonds to form. These bonds make it difficult to separate the silicon wafers from the substrates after scanning lithography is complete. Also, the surfaces of the substrates tend to wear easily, making it necessary to replace the substrates regularly.

In an embodiment, the wafer chuck comprises a silicon silicon carbide layer. Silicon silicon carbide is also known as siliconized silicon carbide. Silicon silicon carbide pieces have increased ability to withstand highly abrasive or harsh chemical environments compared to the corresponding silicon carbide pieces. In addition, silicon carbide layers as wafer chucks are not desirable because the silicon carbide surfaces are so smooth that optical contact bonding occurs between the polished silicon carbide and the polished silicon wafers. This makes removal of the wafers after lithography difficult, and may result in damage to the wafer.

Silicon silicon carbide pieces of the present invention can be made according to any method known in the art. One exemplary method for preparing silicon silicon carbide articles involves the following steps. A silicon carbide powder is mixed with a liquid, for example water, and other optional additives, for example surfactants or deflocculents. The silicon carbide powders can have a variety of grain sizes depending on the desired final properties and dimensions of the article. For example, articles having one inch or less cross sections can be made using silicon carbide powders with gain sizes of 200-300 microns. For larger dimension articles, the powders can have grain sizes over 1000 microns. The mixture is thoroughly mixed in a mill to form a slurry that is transferred to a mold. The water is removed to form a green body of silicon carbide in the shape of the desired article. The green body has porous structure and is can be about 20-90% of its theoretical density.

The article is dried and surrounded with silicon powder and other optional additives, for example carbon powder. Carbon powder can be added to cause reaction bonding of numerous articles during the following heating step. The article and powders are placed in a furnace and heated to a temperature above the melting or vaporization temperature of the silicon powder, typically 1500-2000° C. The green article is infused with the silicon during the heating step. The siliconized silicon carbide article is now densified by the silicon. The silicon has infiltrated the pores of the silicon carbide and forms a matrix of silicon in the article. The densified silicon silicon carbide article has substantially no porosity, as compared to the silicon carbide article. The article is then cooled and washed and processed to form the final part. Processing steps can include a variety of steps, such as washing, inspecting, etching and polishing.

Siliconized silicon carbide has several advantageous properties. First, it has increased abrasion and wear resistance. Silicon silicon carbide is light weight, stiff, mechanically hard and highly thermally conductive. The high thermal conductivity allows for rapid and efficient heat transfer into and out of the wafer. This allows for precise temperature control of the wafer during lithographic scanning. Silicon silicon carbide, compared to the low-thermal expansion glass ceramic substrate, does not wear over time when used as a wafer chuck material, and therefore, does not need to be replaced over time. Silicon silicon carbide is a mixed composite material. Surfaces of silicon silicon carbide expose both silicon carbide bonds (—Si—C—Si—), silicon metal (—Si—) and silicon oxide bonds (—O—Si—O—). Unlike the low-thermal expansion glass ceramic, it is difficult to polish silicon silicon carbide surfaces to near perfect smoothness. Silicon silicon carbide surfaces are polished to smoothness of about 2-5 nm.

The unique properties of silicon silicon carbide make it useful as a material for wafer chucks. However, it is the combination of the unique properties of the low-thermal expansion glass ceramic substrates with the unique properties of the silicon silicon carbide layers that lead to improved wafer chucks. Wafer chucks with these materials combinations are wear and abrasion resistant, highly thermally conductive, have essentially zero coefficients of thermal expansion and allow for easy inclusion of fluid channels for temperature control during scanning lithography.

Embodiments of the Wafer Chuck Structure

Figure 2A:
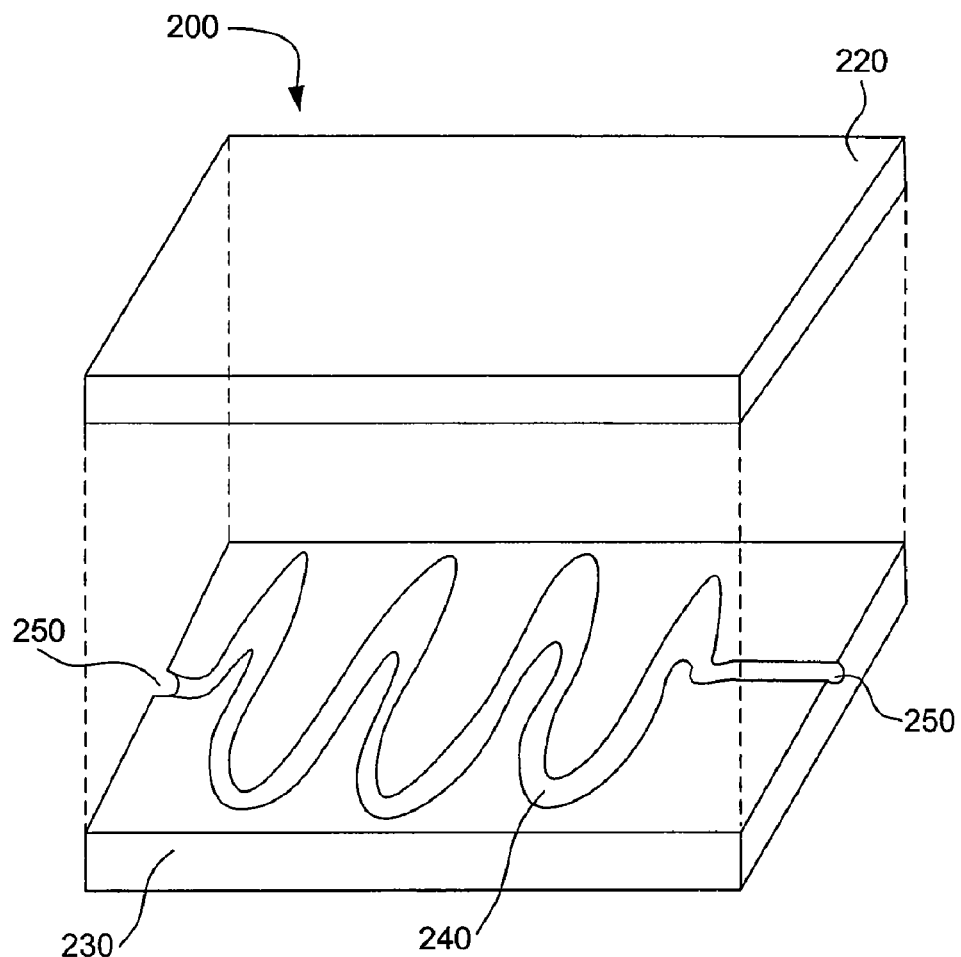
FIG. 2A shows an example wafer chuck having fluid channels through a low-thermal expansion glass ceramic substrate.

FIG. 2A shows wafer chuck 200 in accordance with and embodiment of the present invention. A silicon silicon carbide layer 220 is shown. A low-thermal expansion glass ceramic substrate 230 is shown. Low-thermal expansion glass ceramic substrate 230 includes an open channel 240 through which fluid can flow. The upper portion of channel 240 is exposed, and can be sealed by layer 220. Channel 240 has openings 250 that allow for fluid to be pumped into and out of substrate 230.

Figure 2B:
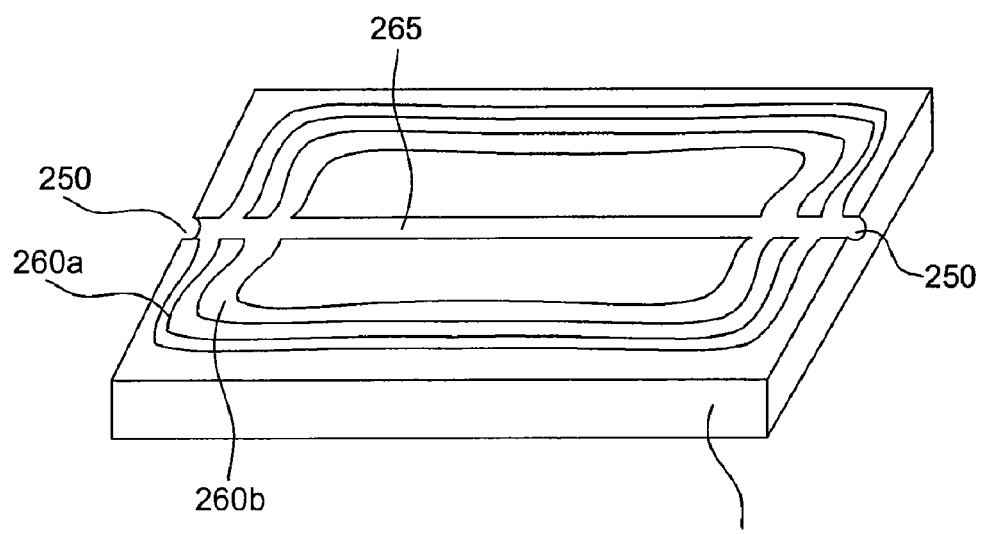
FIGS. 2B-2D show alternative example fluid channel configurations through low-thermal expansion glass ceramic substrates.
Figure 2C:
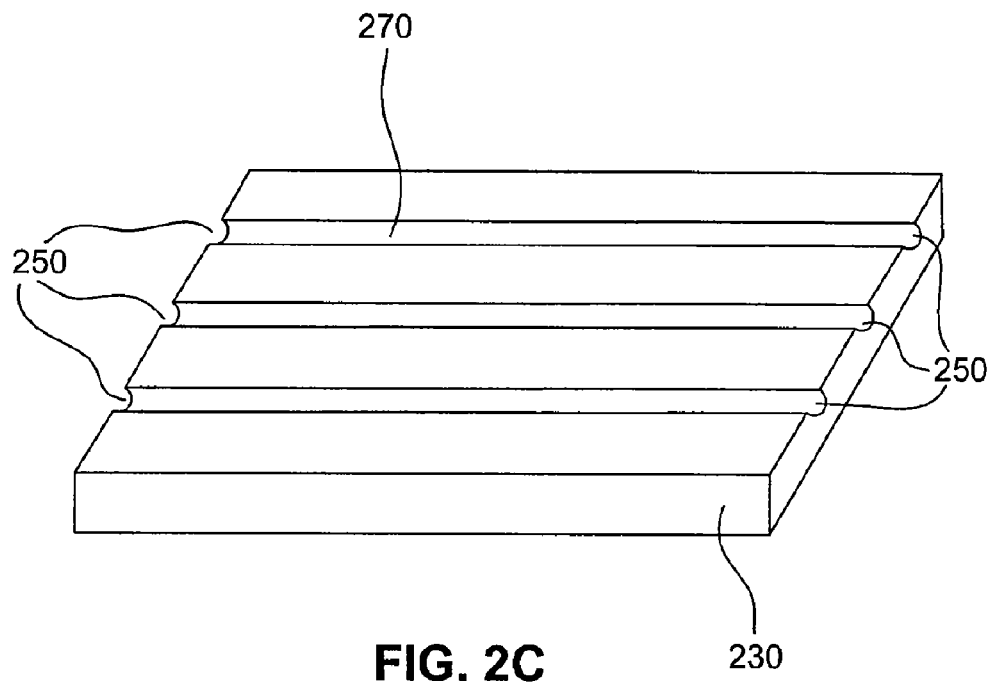
Figure 2D:
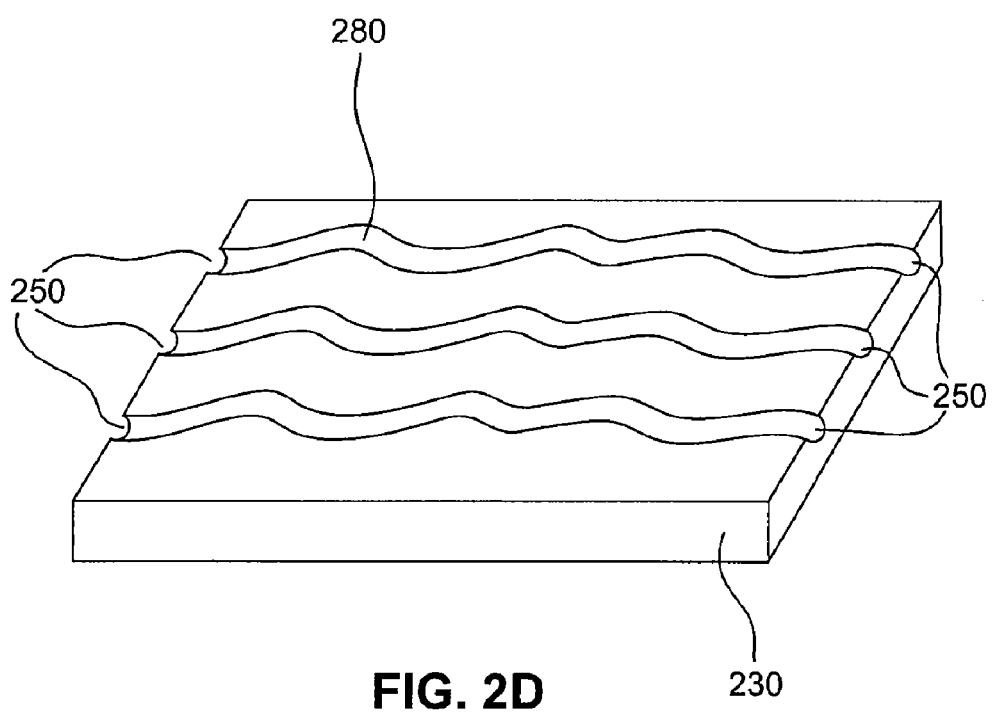

FIGS. 2B-2D show alternative configurations for the fluid channels in accordance with embodiments of the present invention. FIG. 2B shows multiple branching channels 260a and 260b that are connected to a single channel 265 that runs through substrate 230. Substrate 230 has openings 250 for the input and output of fluid via channel 265. FIG. 2C shows multiple linear channels 270 that run through substrate 230, each having openings 250 for the input and output of fluid. FIG. 2D shows multiple zig-zag channels 280 that run through substrate 230, each having openings 250 for the input and output of fluid. Other channel configurations are possible and fall within the scope of this invention, as would become apparent to a person having ordinary skill in the art.

Figure 3A:
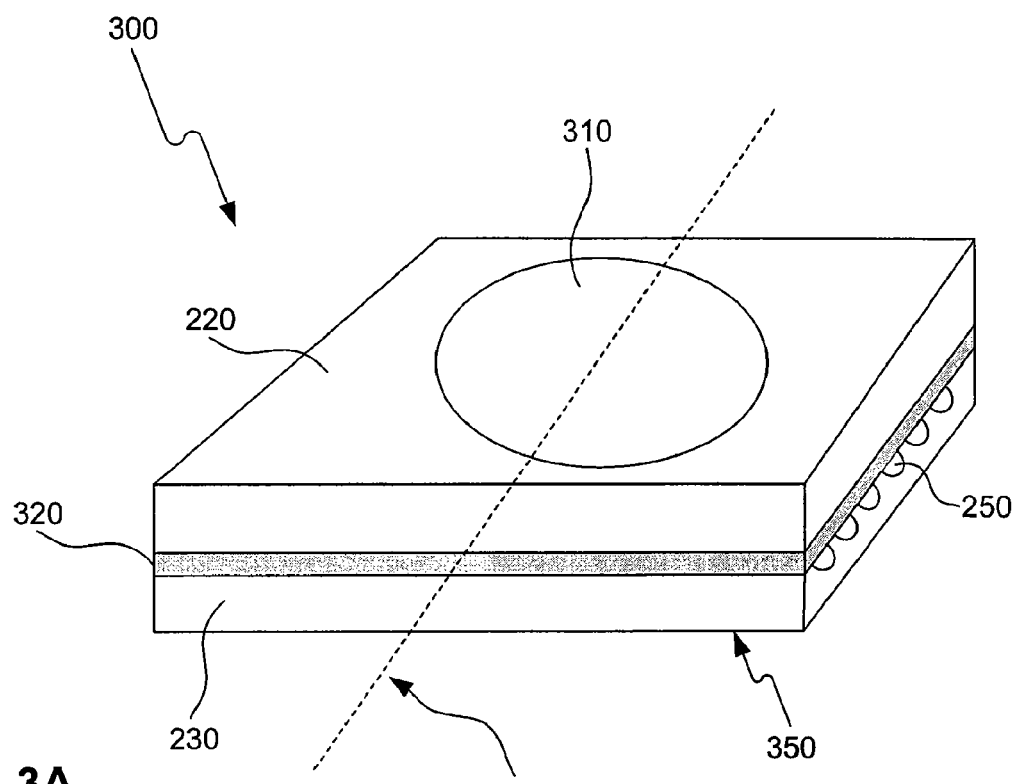
FIGS. 3A and 3B show an example wafer chuck assembly having a silicon silicon carbide layer, a low-thermal expansion glass ceramic substrate and a bonding layer, and its corresponding cross-section.

FIG. 3A shows wafer chuck assembly 300 in accordance with an embodiment of the present invention. Wafer 310 is resting in contact with wafer chuck 350. Wafer chuck 350 includes a silicon silicon carbide layer 220, a low thermal expansion glass ceramic substrate 230, and a bonding layer 320 comprising silicate. Substrate 230 has openings 250 that allow for fluid to be pumped into and out of substrate 230 for heating or cooling, as described above.

Figure 3B:
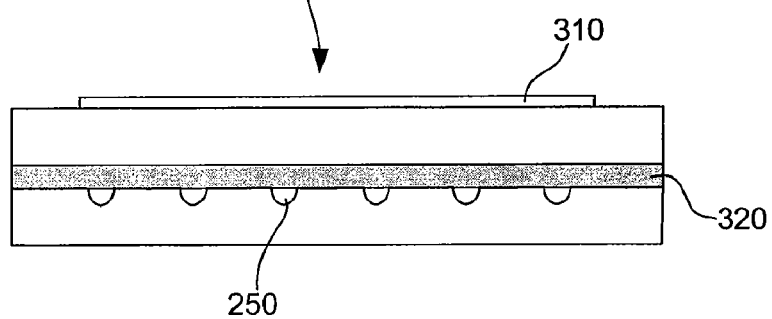

FIG. 3B shows a cross section of wafer chuck assembly 300 in accordance with an embodiment of the present invention. Bonding layer 320 seals openings 250 using layer 220 and substrate 230.

Figure 4:
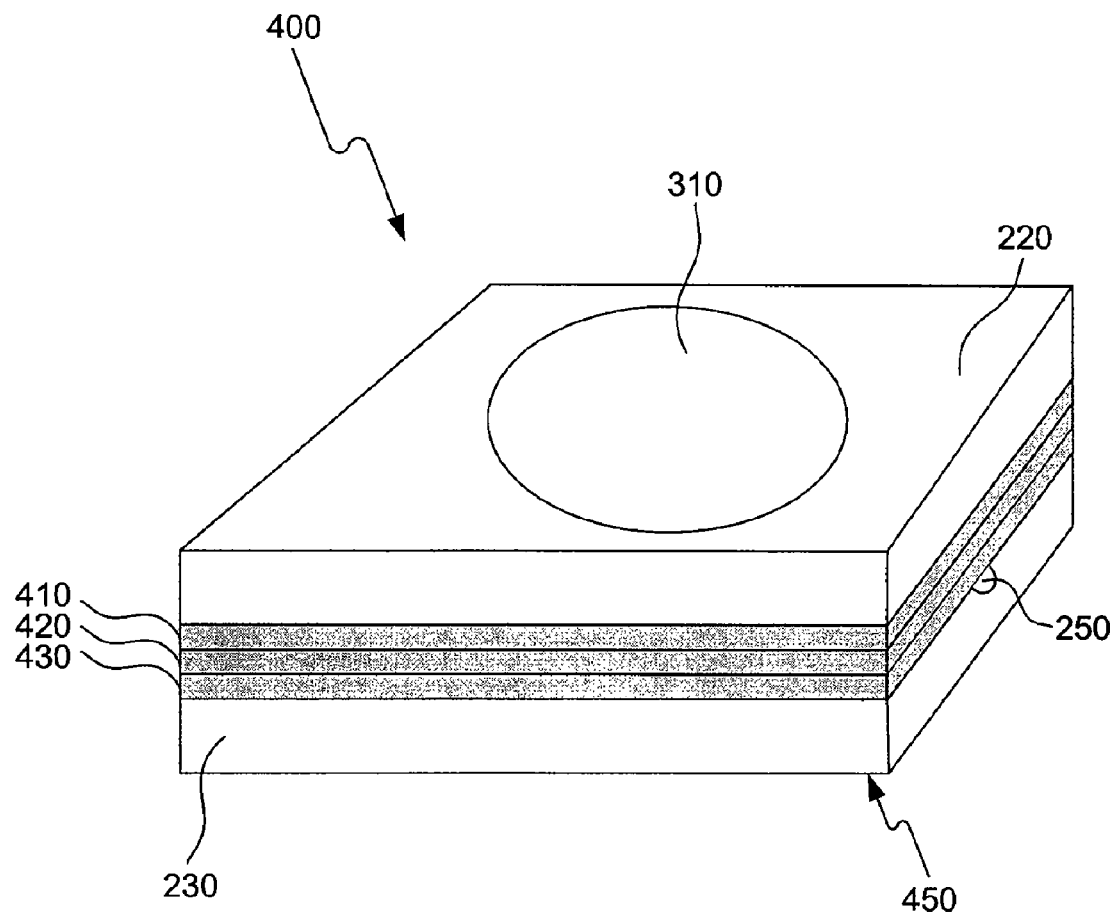
FIG. 4 shows an example wafer chuck assembly having a silicon silicon carbide layer coated with silicon oxide and aluminum oxide, a low-thermal expansion glass ceramic substrate and a bonding layer.

FIG. 4 shows wafer chuck assembly 400 in accordance with an embodiment of the present invention. Wafer 310 is resting in contact with wafer chuck 350. Wafer chuck 350 includes a low thermal expansion glass ceramic substrate 230 and a silicon silicon carbide layer 220. A silicon oxide layer 410 is coated onto a surface of silicon silicon carbide layer 220. An aluminum oxide layer 420 is coated onto silicon oxide layer 410. Bonding layer 320 comprising silicate bonds together substrate 230 and silicon silicon carbide layer 220. Also shown in substrate 230 is opening 250 that allows for fluid to be pumped into or out of substrate 230 for heating or cooling, as described above.

Embodiments of the Bonding Process

Figure 5:
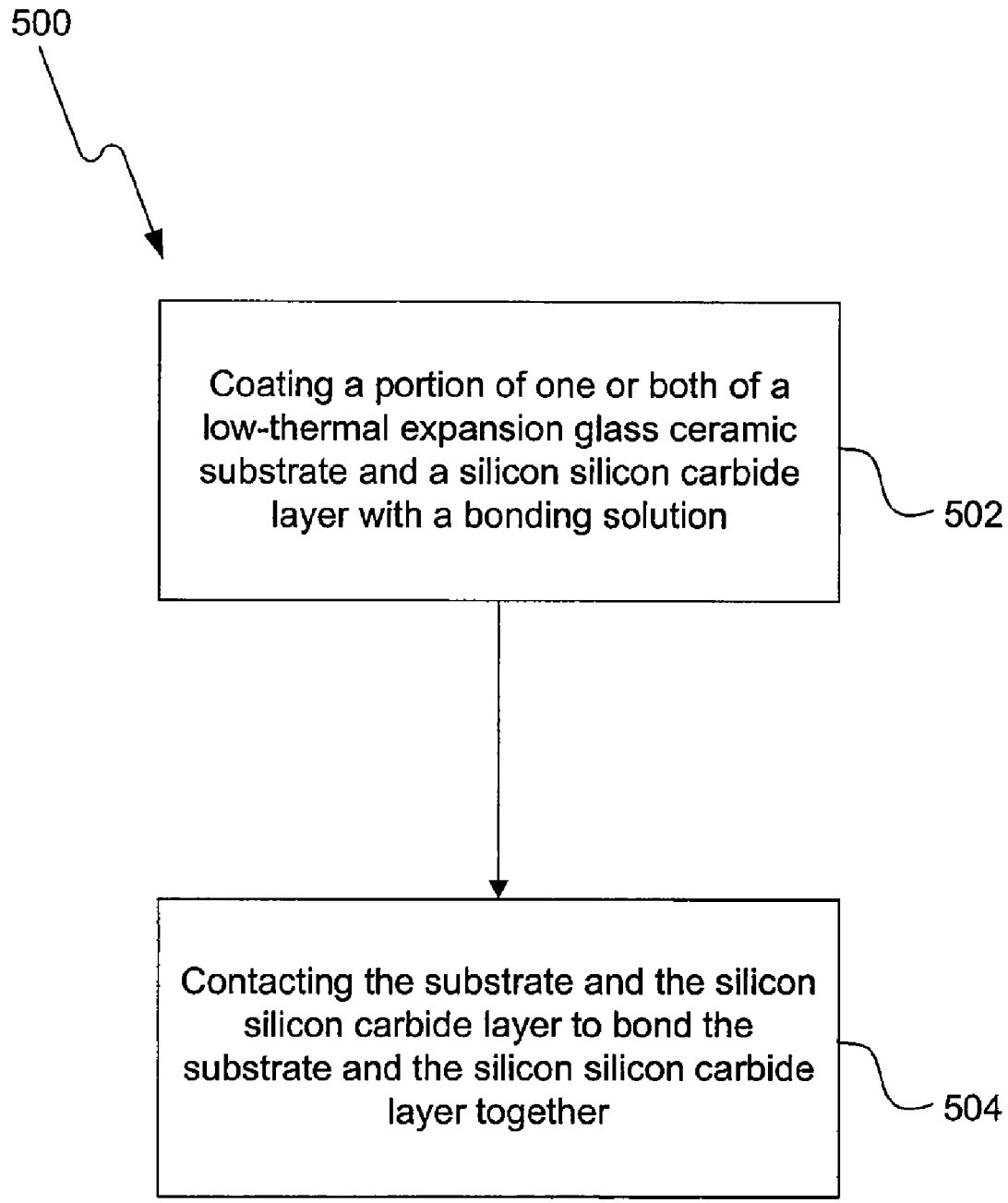
FIG. 5 is a flow diagram of steps in a process for forming a wafer chuck, according to one embodiment.

Another embodiment relates to a method of forming a wafer chuck for use in a lithographic apparatus. FIG. 5 shows flowchart 500 showing example steps for forming a wafer chuck, according to one embodiment. Flowchart 500 begins with step 502. In step 502, a portion of one or both of a low-thermal expansion glass ceramic substrate and a silicon silicon carbide layer is coated with a bonding solution. Methods for coating are well known to a person having ordinary skill in the art. Specific methods include, but are not limited to, spin coating or blade coating one or both of a low-thermal expansion glass ceramic substrate and a silicon silicon carbide layer. The bonding solution can be coated with any thickness, as long as the strength of the bonding layer is at least about 5 megapascals. In one example, the bonding layer is coated with thickness in the range of about 5-500 nm. Referring back to FIG. 5, step 504 follows step 502. In step 504, the low-thermal expansion glass ceramic substrate and silicon silicon carbide layer are contacted to bond the low-thermal expansion glass ceramic substrate and silicon silicon carbide layer together.

In embodiments where the bonding layer is in at least partial contact with the fluid and seals the fluid channels using the silicon silicon carbide layer and low-thermal expansion glass-ceramic substrate, the silicon silicon carbide layer can be coated with the bonding solution, so as not to fill the fluid channels with the bonding solution during the coating process. In one embodiment, the bonding solution can be partially dried on the silicon silicon carbide layer before the low-thermal expansion glass ceramic substrate and silicon silicon carbide layer are contacted.

Figure 6:
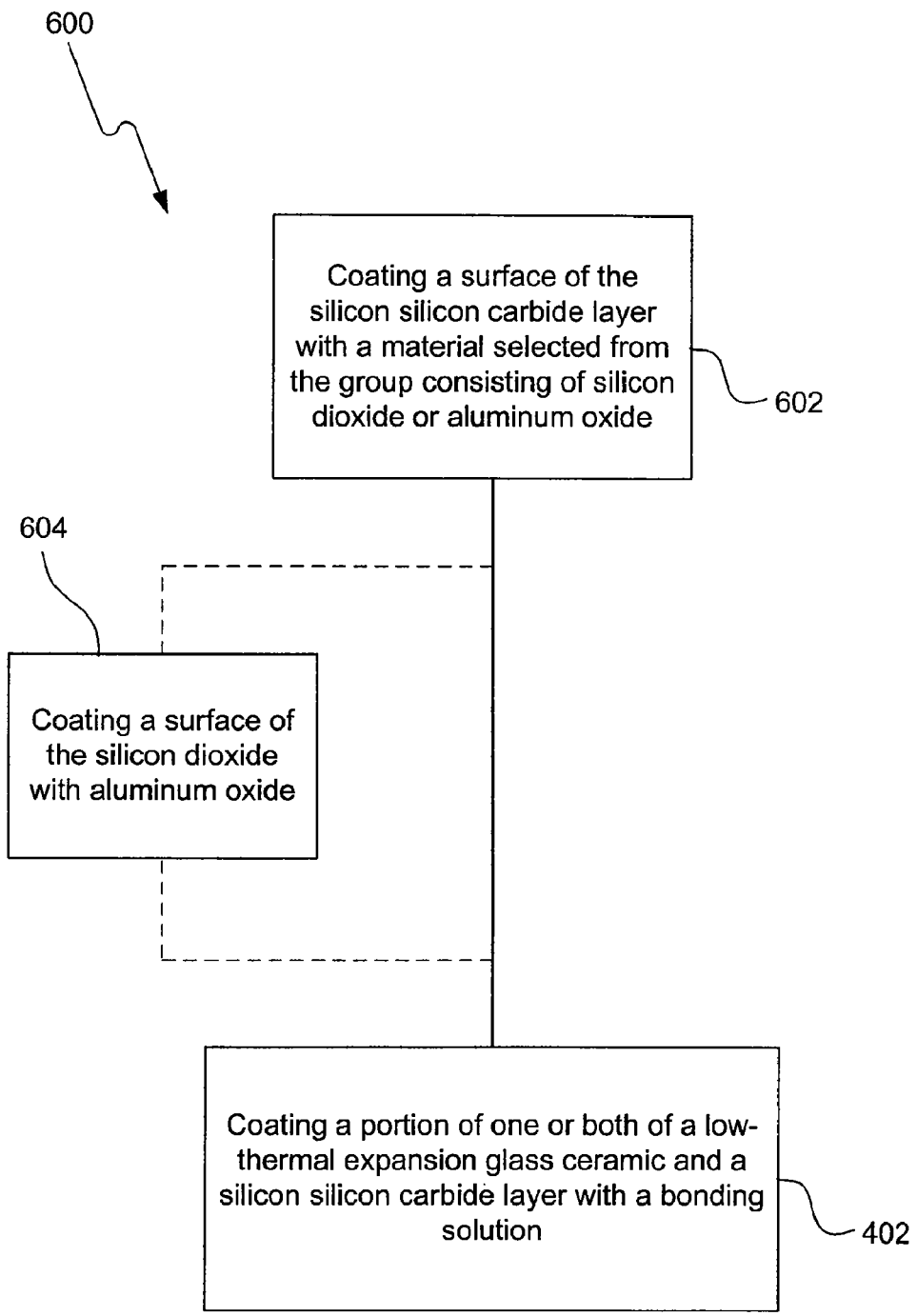
FIG. 6 is a flow diagram of additional, optional steps in a process for forming a wafer chuck, according to one embodiment.

In one embodiment, before the bonding solution is applied, the silicon silicon carbide layer is optionally coated with another material to enhance the strength of the bond. FIG. 6 shows flowchart 600 showing example, optional steps for preparing the surface of the silicon silicon carbide layer for bonding. Flowchart 600 begins with optional step 602. In step 602, a surface of the silicon silicon carbide layer is coated with a material selected from the group consisting of silicon dioxide and aluminum oxide. Methods for coating the silicon silicon carbide layer are discussed below. Step 402 then follows step 602. Alternatively, additional optional step 604 can be performed, following optional step 602, to further prepare the surface of the silicon silicon carbide layer for bonding. In step 604, a surface of said silicon dioxide is coated with aluminum oxide.

Silicon oxide and aluminum oxide can be applied to the surface of the silicon silicon carbide layer by any method known to one of ordinary skill in the art. For example, vapor deposition and sputtering methods can be used, as well as other methods known to a person having ordinary skill in the art. In one example, the sputtering of aluminum or silicon in an oxygen atmosphere allows for the controlled preparation of silicon oxide or aluminum oxide layers on the surface of the silicon silicon carbide layer. Silicon silicon oxide layers are prepared for bonding by coating a portion of the surface with a layer of silicon oxide that is about 20-100 nm, alternatively 40-50 nm thick, alternatively about 50 nm thick. Aluminum oxide layers are coated on the surface of the silicon silicon carbide, or optionally on the silicon oxide layer, in thickness of about 20-100 nm, alternatively 40-50 nm thick, alternatively about 50 nm thick.

Bonding solutions for use in the present invention include those solutions that are capable of forming a bonding layer comprising silicate having a strength of at least about 5 megapascals, the bonding layer attaching the silicon silicon carbide layer to the substrate. Any method of testing the bonding layer strength known to one of ordinary skill in the art can be used. In an embodiment, tensile or sheer bonding strength is measured. For example, an adhesion test can be performed using a Zwick testing machine (Zwick USA, Kennesaw, Ga.) to determine the bonding strength.

In an embodiment, the bonding solution comprises silicate. Silicate solutions are well known in the art, and are commercially available. In an embodiment, silicate includes the monomeric, tetrahedral $SiO_4^{-1}$ anion and its corresponding cation, as well as other related dimeric, trimeric, cyclic or polymeric forms of the monomeric silicate anion and the corresponding cation. This includes, but is not limited to, for example, linear, dimeric $Si_2O_7$ anions, linear trimeric $Si_3O_{10}$ anions, cyclic, trimeric $Si_3O_9$ anions, and the like, and the corresponding cation. In another example, silicate bonding solutions include sodium or potassium silicates. Sodium and potassium silicates can be represented by the ratio of $SiO_2$ to $Na_2O$ or $K_2O$, e.g. $xSiO_2:M_2O$ (where M is sodium or potassium, and x is the weight ratio of silica to metal oxide). Potassium silicates are available with wide ranging weight ratios, including those that range from 1.8 to 2.5 $SiO_2:K_2O$. Examples of commercially available silicate solutions include those available from PQ Corporation, which manufactures liquid sodium silicates with $SiO_2:Na_2O$ ratios as low as 1.6, and anhydrous sodium metasilicate with a ratio of 1.0.

In an embodiment, the bonding solution comprises an aqueous hydroxide solution selected from the group consisting of lithium hydroxide, sodium hydroxide, potassium hydroxide, rubidium hydroxide, cesium hydroxide, beryllium hydroxide, magnesium hydroxide, calcium hydroxide, strontium hydroxide and barium hydroxide.

In an embodiment, the bonding layer comprises silicate. For example, the bonding layer comprises bonds between silicon and oxygen atoms. In another example, the bonding layer further comprises aluminate. For example, the bonding layer further comprises bonds between aluminum and oxygen atoms.

Another embodiment relates to a wafer chuck made according to the methods described herein.

The bonding processes described herein have distinct benefits and advantages over known bonding processes. The bonding layers do not move, i.e. swell and shrink, in the presence of fluids such as water. Movement in the bonding layer and corresponding wafer chuck would make meeting the precise position requirements for lithographic imaging impossible. Epoxy bonding layers known in the art have problems associated with movement over time because they shrink and swell in the presence of water. In addition, the bonding layers described herein allow for the bonding of two surfaces that are not perfectly smooth. Optical contact bonding requires nearly perfectly smooth surfaces in order to achieve the molecular contacts needed for bonding. In addition, the mixed material wafer chucks described herein have distinct benefits. The silicon silicon carbide layer is mechanically tough and does not wear over time, while the low-thermal expansion glass ceramic substrate does not expand in changing temperatures and can be machined to include fluid channels to facilitate temperature control.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention. Thus, the breadth and scope of the present invention should be defined only in accordance with the following claims and their equivalents.

What is claimed is:

1. A method of forming a wafer chuck for use in a lithographic apparatus, comprising:

disposing silicon dioxide onto a surface of a silicon silicon carbide layer;

disposing aluminum oxide onto a surface of said silicon dioxide;

disposing a bonding solution onto a portion of one or both of a glass ceramic substrate and a surface of said aluminum oxide; and bonding said glass ceramic substrate and the surface of said aluminum oxide together.

2. The method of claim 1, wherein said bonding solution comprises silicate.

3. The method of claim 1, wherein said bonding solution comprises an aqueous hydroxide solution selected from the group consisting of lithium hydroxide, sodium hydroxide, potassium hydroxide, rubidium hydroxide, cesium hydroxide, beryllium hydroxide, magnesium hydroxide, calcium hydroxide, strontium hydroxide and barium hydroxide.

* * * * *